United States Patent [19]

Hiratuka et al.

[11] 4,189,653

[45] Feb. 19, 1980

[54] RECTIFIER ASSEMBLY FOR RECTIFYING OUTPUT OF ALTERNATOR FOR INTERNAL COMBUSTION ENGINE

[75] Inventors: Tomoyosi Hiratuka; Akihiro Saito, both of Katsuta, Japan

[73] Assignee: Hitachi, Ltd., Japan

[21] Appl. No.: 887,367

[22] Filed: Mar. 16, 1978

[30] Foreign Application Priority Data

Mar. 19, 1977 [JP] Japan ................................ 52-30748

[51] Int. Cl.² ................................................ H02K 11/00
[52] U.S. Cl. ................................................ 310/68 D
[58] Field of Search .......................... 310/68 R, 68 D; 363/144, 145, 146; 321/8 R

[56] References Cited

U.S. PATENT DOCUMENTS

| | | | |
|---|---|---|---|
| 3,609,428 | 9/1971 | Cotton et al. | 310/68 D X |
| 3,789,275 | 1/1974 | Sawano | 363/145 X |
| 3,895,247 | 7/1975 | Iwata | 310/68 D |
| 3,959,676 | 5/1976 | Striker | 310/68 D |
| 4,065,686 | 12/1977 | Moore | 310/68 D |
| 4,137,560 | 1/1979 | Moore | 310/68 D X |

FOREIGN PATENT DOCUMENTS

2649418  3/1978  Fed. Rep. of Germany ......... 310/68 D
2747229  4/1978  Fed. Rep. of Germany ......... 310/68 D

*Primary Examiner*—Mark O. Budd
*Attorney, Agent, or Firm*—Craig and Antonelli

[57] ABSTRACT

A rectifier assembly for rectifying the output of an alternator for use with an internal combustion engine, comprising a first set of diodes; a second set of diodes; a first arcuate electric conductive plate for cooling the first set of the diodes and for connecting one terminal of each of the first set of the diodes in common with one pole of an external power source; a second arcuate electric conductive plate for cooling the second set of the diodes and for connecting one terminal of each of the second set of the diodes in common with the other pole of the external power source; and a plurality of electric conductive connectors each connecting the other terminal of corresponding one of the first set of the diodes and the other terminal of corresponding one of the second set of the diodes in common with the corresponding one of the phases of an armature winding of an alternator so as to connect the first set of the diodes and the second set of the diodes in a full-wave rectifying circuit. The connectors are insulated from each other by insulating material and molded integrally and arcuately in a single unit by the insulating material to form a connector assembly, and the first and the second arcuate electric conductive plates and the connector assembly are disposed substantially parallel and spaced to each other in a superposed arrangement and insulated from each other to form the rectifier assembly.

7 Claims, 11 Drawing Figures

RECTIFIER ASSEMBLY FOR RECTIFYING OUTPUT OF ALTERNATOR FOR INTERNAL COMBUSTION ENGINE

This invention relates to a rectifier assembly and more particular to a rectifier assembly for rectifying the output of an alternator for use with an internal combustion engine.

Recently, there has been decreasing the space in the engine room of an automobile because of the safety equipment and air-conditioner set mounted in the engine room and there has been increasing electric load owing to the necessity for supplying power to the equipment and the set. The capacity of an alternator to be used must be accordingly increased to supply power to the electric load. Usually, the increase in capacity of the alternator is accompanied by the increase in the size thereof. However, the size of the alternator is limited by the auxiliary equipment mentioned above since the space in the engine room is diminished by the provision of the equipment. Moreover, the increase in the capacity of the alternator results in the increase in the heat generated by the diodes used in the rectifying device for rectifying the ac output of the alternator, which alternator is disposed in the casing of the alternator, so that the dimensions of the plates for cooling the diodes must also be increased to increase the degree of heat dissipation. The size of the plate, however, is also limited in the case where the rectifier assembly is to be disposed in the bracket of the alternator. Therefore, the problem is to reduce the size of the rectifier assembly mounted in the bracket of the alternator with as large a cooling efficiency as possible.

To solve this problem, typical one of the conventional rectifier assembly, e.g. the rectifier assembly disclosed in the specification of U.S. Pat. No. 3,527,972, comprises a first and a second sets of diodes constituting a full-wave rectifier circuit; a first and a second sheet metal strips of circular sector shape, each serving to connect one electrode of the diodes of one of the first and the second sets in common and to cool the diodes; terminals for connecting the other electrodes of the diodes of the first and the second sets with the corresponding phases of the windings of the alternator; and a plate of insulating material having openings for inserting the terminals therein, located substantially parallel to and spaced from the first and the second sheet metal strip. In this type of rectifier assembly, however, the interconnections of the terminals are made by lead conductors and the conductor leads may be broken or disconnected from the terminals due to the vibration transmitted from the engine. The terminals also tend to be loosened due to the vibration. Further, the number of the parts such as bolts and nuts for coupling the terminals, the conductor leads, and the plate of insulating material to the sheet metal strips, is so large that the labor for connecting conductor leads etc. takes so much time, which degrades the assembling work efficiency.

Another rectifier assembly is also known which comprises: a first cooling strip of arc-shape for cooling a first set of diodes and for commonly connecting one electrode of each of the first set of diodes; a second cooling strip of arc-shape for cooling a second set of diodes which form a full-wave rectifying circuit with the first set of diodes and for commonly connecting one electrode of each of the second set of diodes; a plurality of electric conductive connectors each for connecting the other electrode of corresponding one of the first set of diodes and the other electrode of corresponding one of the second set of diodes with corresponding one of phases of an armature winding of an alternator; and a plurality of insulating support members each for supporting corresponding one of the connectors so as to dispose the connectors in insulated relation from each other, wherein the cooling strips are disposed parallel and spaced to each other and the connectors mounted on the support members are disposed on the cooling strips integrally therewith thereby forming the rectifier assembly.

In this case, too, the plural connectors are separately mounted one by one so that the assembly work efficiency is poor and moreover there is a drawback that the connectors tend to be loosened by vibration.

The object of this invention is to eliminate the above drawbacks of the conventional rectifier assembly as described above.

According to this invention, there is provided a rectifier assembly comprising:

a first set of diodes;

a second set of diodes;

a first arcuate electric conductive plate for cooling the first set of the diodes and for connecting one terminal of each of the first set of the diodes in common with one pole of an external power source;

a second arcuate electric conductive plate for cooling the second set of the diodes and for connecting one terminal of each of the second set of the diodes in common with the other pole of the external power source; and a plurality of electric conductive connectors each connecting the other terminal of corresponding one of the first set of the diodes and the other terminal of corresponding one of the second set of the diodes in common with the corresponding one of the phases of an armature winding of an alternator so as to connect the first set of the diodes and the second set of the diodes in a full-wave rectifying circuit. The connectors are insulated from each other by insulating material and molded integrally and arcuately in a single block by the insulating material to form a connector assembly, and the first and the second arcuate electric conductive plates and the connector assembly are disposed substantially parallel and spaced to each other in a superposed arrangement and insulated from each other to form the rectifier assembly.

Other objects, features and advantages will be apparent from the following decription with reference to the accompanying drawings, in which.

Figure 1:
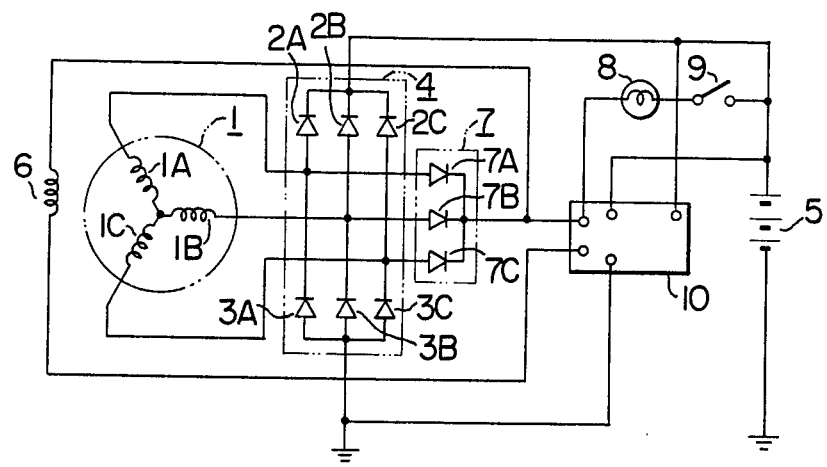
FIG. 1 shows an electric wiring diagram of a rectifier assembly with an alternator for an internal combustion engine, to which this invention is to be applied.
Figure 2:
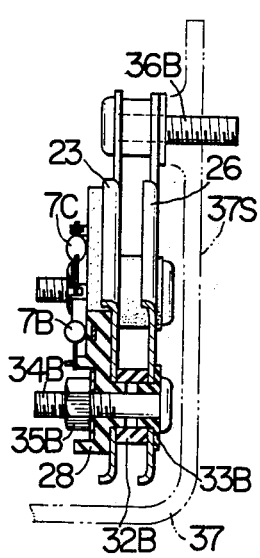
FIG. 2 shows in longitudinal section a part of a rectifier assembly as a first embodiment of this invention, provided in the bracket of an alternator for use with an internal combustion engine.
Figure 3:
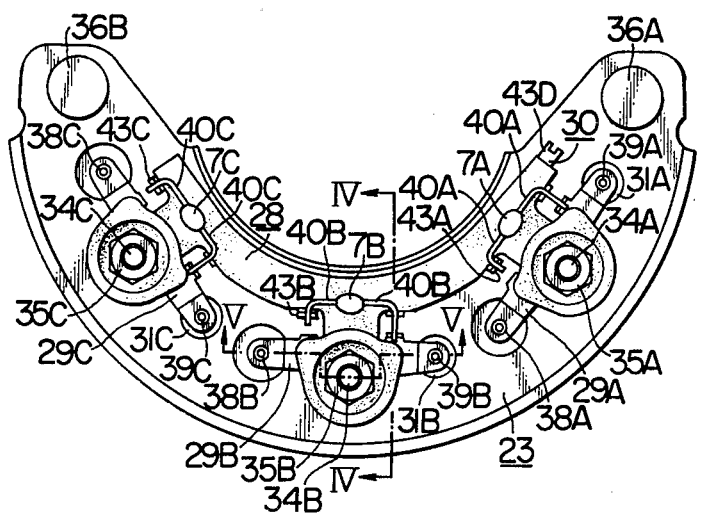
FIG. 3 shows in plan the rectifier assembly shown in FIG. 2.
Figure 4:
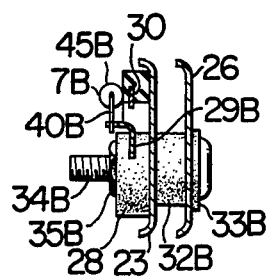
FIG. 4 is a cross section taken along line IV—IV in FIG. 3.
Figure 5:
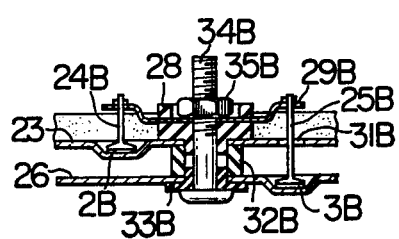
FIG. 5 is a cross section taken along line V—V in FIG. 3.
Figure 6:
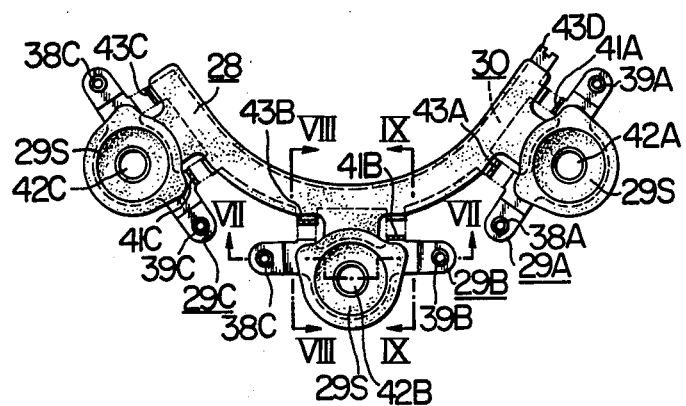
FIG. 6 shows in plan a connecting plate of a rectifier assembly as a second embodiment of this invention, used in an alternator for an internal combustion engine.
Figure 7:
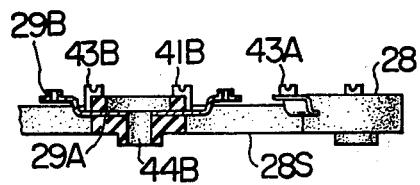
FIG. 7 is a cross section taken along line VII—VII in FIG. 6.
Figure 8:
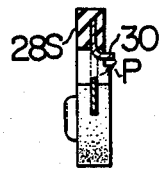
FIG. 8 is a cross section taken along line VIII—VIII in FIG. 6.
Figure 9:
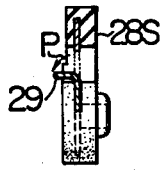
FIG. 9 is a cross section taken along line IX—IX in FIG. 6.

FIG. 1 shows a typical example of an alternator for use with an internal combustion engine, to which this invention is to be applied. Armature winding 1 of an alternator for use with an internal combustion engine (hereafter referred to simply as an alternator) generates therein three-phase alternating voltages. The armature winding 1 consists of three coils 1A, 1B and 1C in Y-connection. The output ends of the coils 1A, 1B and 1C are connected respectively with the anodes of the diodes 2A, 2B and 2C of a first set, the cathodes of the diodes 3A, 3B and 3C of a second set, and the anodes of the diodes 7A, 7B and 7C of a third set. The anodes of the diodes 3A, 3B and 3C of the second set are connected in common with the earth while the cathodes of the diodes 2A, 2B and 2C of the first set are connected in common with one of the poles, e.g. positive pole, of a battery 5. The other pole, e.g. negative pole, of the battery 5 is grounded. The diodes 2A to 2C and the diodes 3A to 3C of the first and the second sets constitute a three-phase full-wave rectifier circuit 4 for rectifying the ac outputs of the armature winding 1. One end of a field coil 6 of the alternator is connected with the output terminal of an auxiliary rectifier circuit 7 consisting of the diodes 7A, 7B and 7C and further connected with the positive pole of the battery 5 through a battery-charge display lamp 8 and an ignition key switch 9 while the other end of the field coil 6 is grounded through a voltage regulator 10. The auxiliary rectifier circuit 7 serves to energize the battery-charge display lamp 8.

FIGS. 2 to 9 show embodiments of a rectifier assembly according to this invention, especially the assembly of the three-phase full-wave rectifier circuit 4 and the auxiliary rectifier circuit 7. In the figures, an arcuate conductive plate 23 serves to connect the diodes 2A, 2B and 2C in common with the positive pole of the battery 5 and also to cool the diodes and an arcuate conductive plate 26 serves to connect the diodes 3A, 3B and 3C in common with the earth and also to cool them. An arcuate connecting plate 28 is formed by molding with insulating material terminal plates 29A, 29B, 29C and 30 on which the three-phase full-wave rectifier circuit and the auxiliary rectifier circuit are constructed. The diodes 7A, 7B and 7C constituting the auxiliary rectifier circuit are connected respectively between the terminal plates 29A and 30, between the terminal plates 29B and 30, and between the terminal plates 29C and 30. The connecting plate 28 and the arcuate plates 23 and 26 are assembled together by insulating bushes 32A, 32B and 32C, insulating washers 33A, 33B and 33C, bolts 34A, 34B and 34C, and nuts 35A, 35B and 35C to form a single unit and the unit is then attached rigidly onto the inner wall of the bracket 37 of the alternator by means of, for example, bolts 36 and 36'. The arcuate plates 23 and 26 are supported horizontally.

In the thus prepared structure, one ends of the diodes 2A, 2B and 2C are soldered to the arcuate conductive and cooling plate 23 and the other ends of the same diodes are soldered respectively to the heads of rivet-shaped lead conductors 24A, 24B and 24C. One ends of the diodes 3A, 3B and 3C are soldered to the arcuate conductive and cooling plate 26 and the other ends of the same diodes are soldered to the heads of rivet-shaped lead conductors 25A, 25B and 25C. The tip ends of the rivet-shaped leads 24A, 24B and 24C are inserted respectively in the holes cut in terminals 38A, 38B and 38C of approximate Z-shape provided on the terminal plates 29A, 29B and 29C and soldered to the terminals 38A, 38B and 38C. The tip ends of the rivet-shaped leads 25A, 25B and 25C are inserted respectively in holes cut in terminals 39A, 39B and 39C of approximate Z-shape provided on the terminal plates 29A, 29B and 29C through throughholes 31A, 31B and 31C cut in the arcuate conductive and cooling plate 23 and soldered to the terminals 39A, 39B and 39C. As a result of this connection, a three-phase full-wave rectifier circuit is completed.

Now, the connecting plate 28 will be described in further detail. In the molding of the connecting plate 28, the terminal plates 29A, 29B and 29C and the arcuate terminal plate 30 are integrally molded and by cutting the integral mold along the two-short-and-a-long dash line in FIG. 6 by means of punching, four separate plates with their insulating material thereon are obtained. By bending the cut portions as indicated by arrows P in FIGS. 8 and 9, tag terminals 41A, 41B and 41C are integrally formed on the terminal plates 29A, 29B and 29C and tag terminals 43A, 43B and 43C are integrally formed on the terminal plate 30. Slits for holding the lead conductors 40A to 40C of the diodes 7A to 7C are cut in the tag terminals 41A to 41C and 43A to 43C. The lead conductors 40A of the diode 7A are held by and soldered to the tag terminals 41A and 43A, the lead conductors 40B of the diode 7B are held by and soldered to the tag terminals 41B and 43B, and the lead conductors 40C of the diode 7C are held by and soldered to the tag terminals 41C and 43C. The tag terminals 41A to 41C and 43A to 43C are so formed as to protrude from the insulating material, by bending the portions of the terminal plates at right angle with the surface 28S of the connecting plate 28. Throughholes 42A, 42B and 42C are bored through the terminal plates 29A, 29B and 29C, in which the bolts 34A, 34B and 34C are inserted. The surfaces 29S of the terminal plates 29A, 29B and 29C around the throughholes 42A, 42B and 42C are bared of insulating material by a special process such as counterboring. The bared surfaces 29S are parallel to the surface 28S and serve to provide electric connection with the nuts 35A, 35B and 35C. The terminal plate 30 is also provided with a tag terminal 43D with a slit, which protrudes from the connecting plate 28, even with the surface 28S thereof. Throughholes 44A, 44B and 44C are cut in the insulating material of the connecting plate 28, which are concentric with the throughholes 42A, 42B and 42C for receiving the bolts 34A, 34B and 34C therein.

The diodes 7A, 7B and 7C soldered to the terminals 41A to 41C and 43A to 43C respectively have the lead conductors 40A, 40B and 40C soldered to the surfaces of their diode elements and the soldered portions are sealed for surface passivation by glass layers 45A, 45B and 45C. The tag terminal 43D is connected with the end of the field coil 6 and the nuts 35A, 35B and 35C are connected with the ends of the coils 1A, 1B and 1C of the armature winding 1, respectively. One of the bolts 36A and 36B is connected with the arcuate conductive and cooling plate 23, protrudes from the rear surface 37S of the bracket 37, fixed by, for example, a nut, and is insulated from the arcuate conductive and cooling plate 26 and the bracket 37 by insulating material. The protruding end of the bolt is connected with the positive pole of the battery 5. The other bolt is insulated from the plate 23 by insulating material, connected with the plate 26 and grounded. Alternatively, the bolts 36A and 36B may be omitted, the arcuate conductive and cooling plates 23 and 26 and the connecting plate 28 may be integrally assembled, and the positive pole of the battery 5 may be connected with a terminal provided on the plate 23.

According to the above embodiment of this invention, the following effects are obtained. Namely, since the cooling plates 23 and 26 and the connecting plate 28 are formed in semicircular configuration concentric with the cylindrical side wall of the bracket 37 and disposed parallel to the end wall surface 37S, the rectifier assembly can be compactly disposed in the bracket 37 with an excellent cooling efficiency and without increasing the axial length and the radial dimensions of the alternator. Moreover, according to this invention, a single plate is molded with insulating material and thereafter the molded plate is split by punching into four terminal plates 29A, 29B, 29C and 30 so that each terminal plate and the insulating material are integrally formed. This structure spares the labor for assembling the terminals and their associated insulator pieces, so improving the productivity and reducing the production cost. Further, the integral molding of the terminal plates with insulating material enables the terminal plates to be simply and securely held, to be insulated completely from each other, and to be prevented from being loosened due to the vibration of the engine. Furthermore, according to this invention, the electric connection of the connecting plate, the three-phase full-wave rectifier circuit and the auxiliary rectifier circuit and the support of the diodes 7A, 7B and 7C can be made simply and compactly so that the productivity is improved and the cost is reduced.

Figure 10:
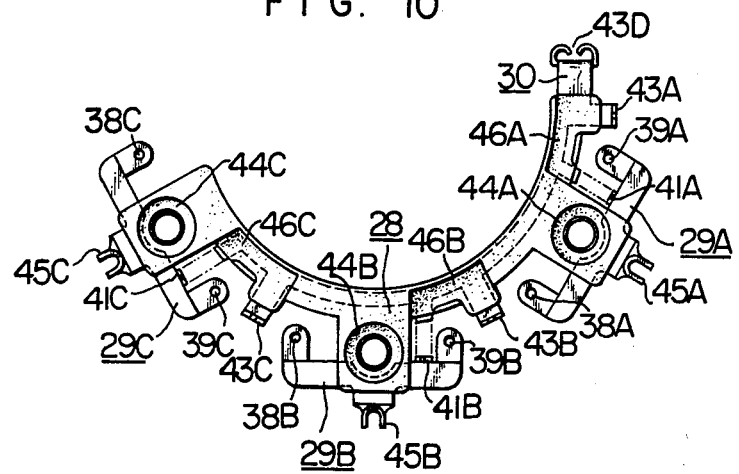
FIG. 10 shows in plan a connecting plate of a rectifier assembly as a third embodiment of this invention.
Figure 11:
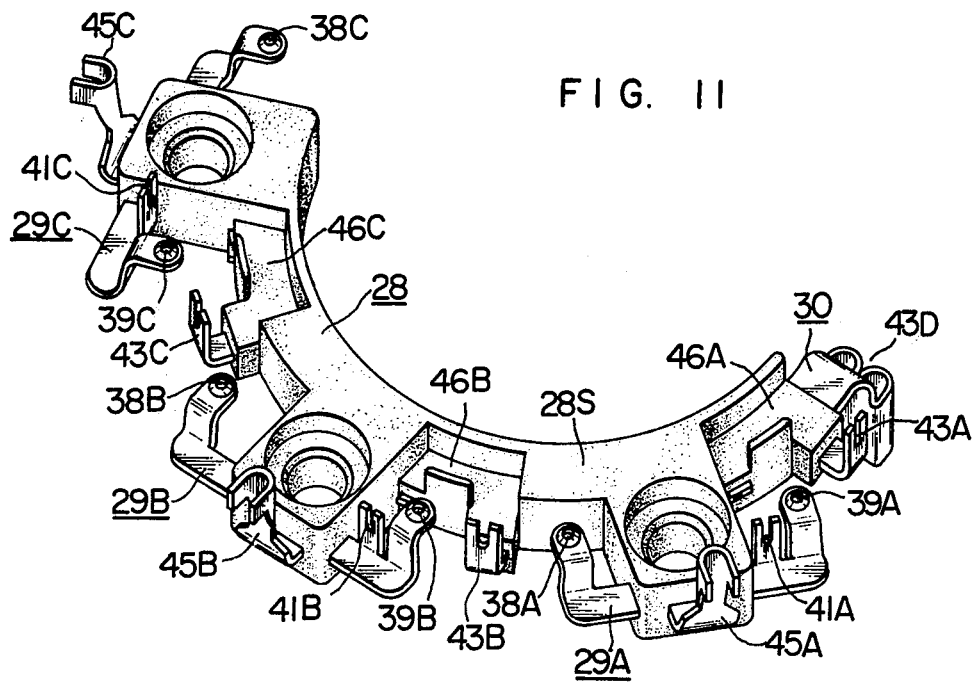
FIG. 11 is a perspective view of the connecting plate shown in FIG. 10.

FIGS. 10 and 11 show a connecting plate of a rectifier assembly as another embodiment of this invention. Throughout the figures, FIG. 1 to FIG. 11, the same reference numerals or characters indicate like parts or elements. As shown in FIG. 10, the connecting plate 28 in this embodiment consists of the three terminal plates 29A, 29B and 29C and the arcuate terminal plate 30 which are integrally formed as indicated by two-short-and-a-long dash line and molded with insulating material. In the next step of fabrication process, the plates 29A, 29B, 29C and 30 are split from each other by cutting the portions indicated by the two-short-and-a-long dash lines by punching. The tag terminals 41A, 41B and 41C having slits are integrally formed of the terminal plates 29A, 29B and 29C by bending the respective cut portions perpendicularly to the surface 28S of the connecting plate 28 so as to make the cut portions protrude from the insulating material. In the same manner, the tag terminals 43A, 43B and 43C having slits are integrally formed of the terminal plate 30. The diodes 7A, 7B and 7C are held respectively between the tag terminals 41A and 43A, 41B and 43B, and 41C and 43C. U-shaped grooves 46A, 46B and 46C are cut in the insulating material of the connecting plate 28 to receive the diodes 7A, 7B and 7C therein and to support them fixedly. The terminals 38A, 38B and 38C, and 39A, 39B and 39C of the terminal plates 29A, 29B and 29C have holes in which the tip ends of the rivet-shaped lead conductors are inserted. The terminals 38A to 38C and 39A to 39C of the terminal plates 29A, 29B and 29C are shaped approximately in the form of Z perpendicular to the surface 28S of the connecting plate 28, to provide flexibility so that the vibration of engine can be absorbed and the diodes 2A to 2C and 3A to 3C can be stably supported. Terminals 45A, 45B and 45C having U-shaped grooves are integrally formed in the radially peripheral portions of the terminal plates 29A, 29B and 29C, the terminals 45A, 45B and 45C being perpendicular to the surface 28S of the connecting plate 28 and protruding from the insulating material. Since the terminals 45A, 45B and 45C are located in the radial periphery, the soldering of the ends of the coils 1A, 1B and 1C to the terminals can be facilitated. The ends of the coils 1A, 1B and 1C are fitted in the grooves and soldered there. The shape U of the grooves are so made as to improve the facility to hold the coil ends therein. The terminal 43D is formed integrally of the terminal plate 30. The terminal 43D is bent perpendicular to the surface 28S of the connecting plate 28, has a cylindrical grooves, and is connected with the field coil 6.

This embodiment has not only the same effect as obtained by the embodiments shown in FIGS. 2 to 9, but also the effect of more easily and fixedly supporting the diodes 7A, 7B and 7C by the provision of the grooves 46A, 46B and 46C in the insulating material of the connecting plate 28 and the effect of stably supporting the coils 1A, 1B and 1C by the integral formation of the terminal plate 30 and the terminals 45A, 45B and 45C with which the coils 1A, 1B and 1C are connected.

In the foregoing description, the rectifier is limited to a three-phase full-wave rectifier circuit. However, it should be appreciated that the application of this invention is by no means limited to those embodiments, but that the invention can also be applied to the polyphase full-wave rectifier circuit with or without the auxiliary rectifier circuit. In the case where the auxiliary rectifier circuit is omitted, the terminal plate 30 is needless and the necessary terminal plates 29A, 29B and 29C are formed by molding a single plate with insulating material and thereafter by splitting it into three pieces through punching process.

What we claim is:

1. A rectifier assembly for rectifying the output of an alternator for an internal combustion engine, said rectifier assembly comprising:
   a first set of diodes;
   a second set of diodes;
   a first arcuate electric conductive plate for cooling said first set of diodes and for connecting one terminal of each of said first set of diodes in common with one pole of an external power source;
   a second arcuate electric conductive plate for cooling said second set of diodes and for connecting one terminal of each of said second set of diodes in common with the other pole of said external power source; and
   a plurality of first electric conductive connectors each connecting the other terminal of corresponding one of said first set of diodes and the other terminal of corresponding one of said second set of diodes in common with the corresponding one of the phases of an armature winding of the alternator so as to connect said first set of diodes and said second set of diodes in a full-wave rectifying circuit, wherein said first connectors are insulated from each other by insulating material and molded integrally and arcuately in a single unit by the insulating material to form a connector assembly, and said first and second arcuate electric conductive plates and said connector assembly are disposed substantially parallel and spaced to each other in a superposed arrangement and insulated from each other to form the rectifier assembly.

2. A rectifier assembly as claimed in claim 1, further comprising:

a third set of diodes; and a second electric conductive connector for connecting one terminal of each of said third set of diodes in common with a field winding of said alternator, wherein the other terminal of each of said third set of diodes are connected respectively with the corresponding one of the phases of said armature winding through the corresponding one of said first connectors and said connector assembly is formed by arcuately and integrally molding said first and second connectors with insulating material, with said first and second connectors insulated from each other by the insulating material.

3. A rectifier assembly as claimed in claim 1 or 2, wherein each of said first connectors is made of a sheet of electric conductive plate and said plate has a first terminal with which the other terminal of corresponding one of said first set of diodes is connected and a second terminal with which the other terminal of corresponding one of said second set of diodes is connected.

4. A rectifier assembly as claimed in claim 2, wherein each of said first connectors is made of a sheet of conductive plate and said plate has a first terminal with which the other terminal of corresponding one of said first set of diodes is connected, a second terminal with which the other terminal of corresponding one of said second set of diodes is connected, and a third terminal with which the other terminal of corresponding one of said third set of diodes is connected; and said second connector has a plurality of fourth terminals and a fifth terminal, each of said fourth terminals being connected with one terminal of corresponding one of said third set of diodes and said fifth terminal being connected with said field winding.

5. A rectifier assembly as claimed in claim 2 or 4, wherein the insulating material of said connector assembly has a plurality of grooves in which said third set of diodes are respectively received and supported.

6. A rectifier assembly as claimed in claim 3 or 4, wherein each of said first connectors also has a sixth terminal provided at the radially peripheral portion of said connector assembly, said sixth terminal being connected with the corresponding one of the phases of said armature winding.

7. A rectifier assembly as claimed in claim 3 or 4, wherein said first and second terminal are formed approximately in the shape of Z.

* * * * *

UNITED STATES PATENT AND TRADEMARK OFFICE
CERTIFICATE OF CORRECTION

PATENT NO. : 4,189,653
DATED : February 19, 1980
INVENTOR(S) : Tomoyosi Hiratuka et al.

It is certified that error appears in the above—identified patent and that said Letters Patent is hereby corrected as shown below:

Column 1, line 20, "equipments" should read -- equipment --.

Column 1, line 22, "equipments" should read -- equipment --.

Column 1, line 41, "the", first occurrence, should read -- each --.

Column 1, line 41, "one", second occurrence, should read -- each --

Column 1, line 41, "diodes" should read -- diode --.

Column 2, line 36, "and" should read -- to --.

Column 2, line 67, "second" should read -- first --.

Column 3, line 18, "third" should read -- second --.

Column 3, line 41, after "show" insert -- an --.

Column 3, line 41, "embodiments" should read -- embodiment --.

Signed and Sealed this

Twenty-second Day of July 1980

[SEAL]

Attest:

SIDNEY A. DIAMOND

Attesting Officer     Commissioner of Patents and Trademarks